United States Patent
Song et al.

(10) Patent No.: US 8,299,843 B2
(45) Date of Patent: Oct. 30, 2012

(54) THREE-POLE THREE-THROW SWITCH AND COMMUNICATION DEVICE

(75) Inventors: Ai-Ning Song, Shanghai (CN); Xiao-Yan Liu, Shanghai (CN); Su-Qin Li, Shanghai (CN)

(73) Assignees: Ambit Microsystems (Shanghai) Ltd., Shanghai (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 93 days.

(21) Appl. No.: 12/981,435

(22) Filed: Dec. 29, 2010

(65) Prior Publication Data

US 2012/0119818 A1    May 17, 2012

(30) Foreign Application Priority Data

Nov. 12, 2010  (CN) .......................... 2010 1 0541564

(51) Int. Cl.
*H03K 17/74* (2006.01)
(52) U.S. Cl. .......................... 327/493; 327/503; 333/107
(58) Field of Classification Search .................. 333/101, 333/103–107, 262; 327/493–497, 504, 505, 327/503
See application file for complete search history.

(56) References Cited

U.S. PATENT DOCUMENTS

| | | | |
|---|---|---|---|
| 3,982,212 A * | 9/1976 | Wallington et al. .......... | 333/104 |
| 5,170,139 A * | 12/1992 | Nelson .......................... | 333/103 |
| 5,235,250 A | 8/1993 | Cronk | |
| 5,296,762 A * | 3/1994 | Hanson et al. ................ | 327/552 |
| 5,510,757 A * | 4/1996 | Kumar et al. ................. | 333/104 |
| 5,642,083 A * | 6/1997 | Kato et al. .................... | 333/103 |
| 6,356,166 B1 * | 3/2002 | Goldsmith et al. ........... | 333/161 |
| 6,496,082 B1 * | 12/2002 | DiPiazza ........................ | 333/101 |
| 6,998,932 B2 * | 2/2006 | Taguchi et al. ............... | 333/101 |
| 7,528,678 B2 * | 5/2009 | Tamura et al. ................ | 333/103 |
| 7,609,126 B2 * | 10/2009 | Yamamoto et al. ......... | 333/81 R |
| 7,719,383 B2 * | 5/2010 | Gu ................................. | 333/101 |
| 7,816,996 B2 * | 10/2010 | Gu ................................. | 333/101 |
| 7,898,359 B2 * | 3/2011 | Darriet et al. ................. | 333/103 |

* cited by examiner

*Primary Examiner* — Thomas J Hiltunen
(74) *Attorney, Agent, or Firm* — Altis Law Group, Inc.

(57) ABSTRACT

A three-pole three-throw switch and a communication device employing the three-pole three-throw switch includes six diodes and six inductors. The six diodes are connected in series with a same direction. Common nodes of each two diodes form three poles and three throws. The three poles and the three throws are linked together in circular form. The three poles and the three throws receive control signals via the six inductor, respectively.

2 Claims, 4 Drawing Sheets

Truth table of control signals

| S1 | S2 | S3 | The closed path | |
|----|----|----|-----------------|---|
| 1 | 0 | 0 | A First pole to a first throw | A third pole to a second throw |
| 0 | 1 | 0 | A second pole to the first throw | The third pole to a third throw |
| 0 | 0 | 1 | The first pole to the third throw | The second pole to the second throw |

FIG. 2

THREE-POLE THREE-THROW SWITCH AND COMMUNICATION DEVICE

BACKGROUND

1. Technical Field

Embodiments of the present disclosure relate to switches, and particularly to a three-pole three-throw (3P3T) switch and a communication device employing the three-pole three-throw switch.

2. Description of Related Art

Communication devices cover more and more frequency bands with wireless technology developments. Therefore, it is necessary for the communication devices to comprise three or more paths to transceive signals covering different frequency bands. Single-pole double-throw (SPDT) switches and double-pole double-throw (DPDT) switches are designed to form three-pole three-throw (3P3T) switches. However, this kind of design is not only expensive, but also a waste of space. In order to obtain compact the three-pole three-throw switch switches and corresponding communication devices employing the three-pole three-throw switch switches, the 3P3T switches associated therewith are correspondingly required to be designed with a small size.

BRIEF DESCRIPTION OF THE DRAWINGS

FIG. 2 is a schematic diagram of one exemplary embodiment of a truth table of control signals in the 3P3T switch of FIG. 1;

DETAILED DESCRIPTION

Figure 1:
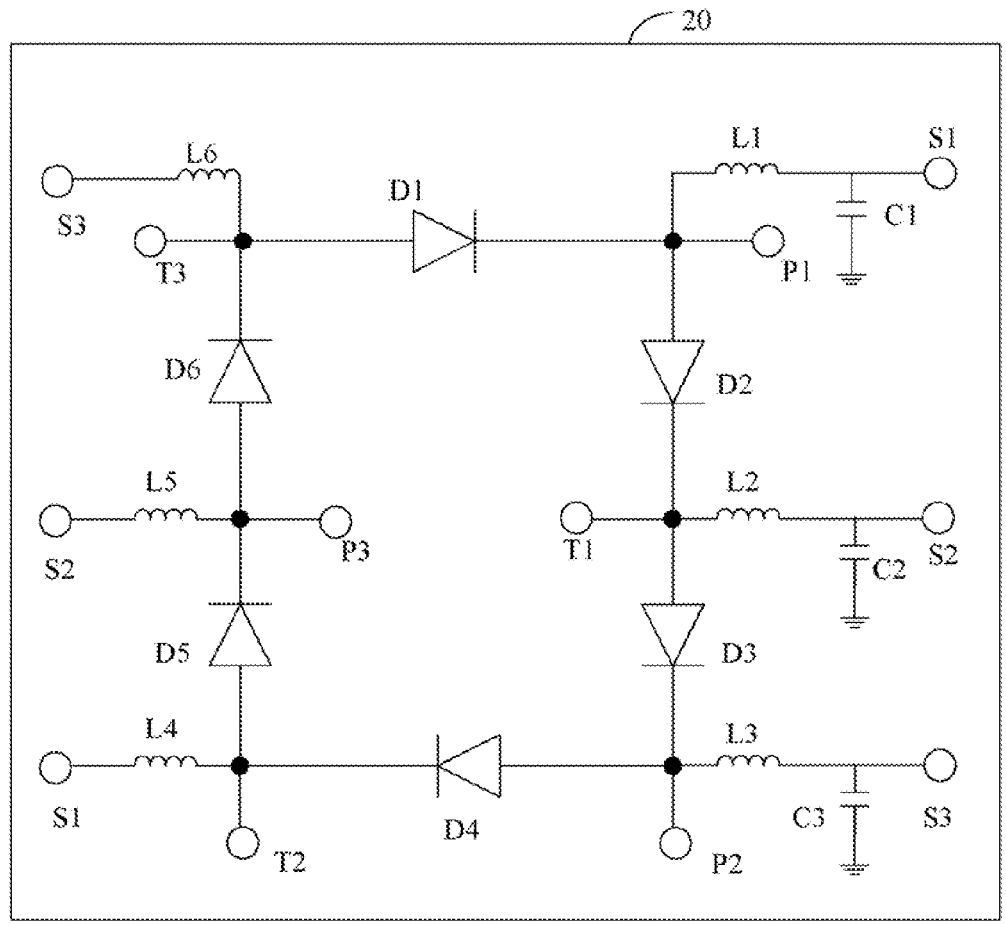
FIG. 1 is a circuit diagram of one exemplary embodiment of a three-pole three-throw (3P3T) switch of the present disclosure.

Referring to FIG. 1, a circuit diagram of one exemplary embodiment of a three-pole three-throw (3P3T) switch 20 of the present disclosure is shown.

In one embodiment, the 3P3T switch 20 comprises a first diode D1, a second diode D2, a third diode D3, a fourth diode D4, a fifth diode D5, and a sixth diode D6 connected in series with a same direction. The six diodes D1-D6 can form a circular closed loop, such that a cathode of one of the diodes is connected to an anode of another one of the diodes.

In detail, a common node of a cathode of the first diode D1 and an anode of the second diode D2 forms a first pole P1. A common node of a cathode of the second diode D2 and an anode of the third diode D3 forms a first throw T1. A common node of a cathode of the third diode D3 and an anode of the fourth diode D4 forms a second pole P2. A common node of a cathode of the fourth diode D4 and an anode of the fifth diode D5 forms a second throw T2. A common node of a cathode of the fifth diode D5 and an anode of the sixth diode D6 forms a third pole P3. A common node of a cathode of the sixth diode D6 and an anode of the first diode D1 forms a third throw T3.

The 3P3T switch 20 further comprises a first inductor L1, a second inductor L2, a third inductor L3, a fourth inductor L4, a fifth inductor L5, and a sixth inductor L6, which connects to aforementioned common nodes between the sixth diodes D1~D6, respectively. In one embodiment, the inductors L1~L6 are operable to pass control signals S1~S3 with high level, and block alternating current (AC) signals received via the D1~D6. The terms of "high-level" and "low-level" refer to logic signals, the high-level means logic 1, and the low-level means logic 0

In detail, the common node of the cathode of the first diode D1 and the anode of the second diode D2 receives a first control signal S1 via the first inductor L1. The common node of the cathode of the second diode D2 and the anode of the third diode D3 receives a second control signal S2 via the second inductor L2. The common node of the cathode of the third diode D3 and the anode of the fourth diode D4 receives a third control signal S3 via the third inductor L3. The common node of the cathode of the fourth diode D4 and the anode of the fifth diode D5 receives the first control signal S1 via the fourth inductor L4. The common node of the cathode of the fifth diode D5 and the anode of the sixth diode D6 receives the second signal S2 via the fifth inductor L5. The common node of the cathode of the sixth diode D6 and the anode of the first diode D1 receives the third control signal S3 via the sixth inductor L6.

The 3P3T switch 20 further comprises a first capacitor C1, a second capacitor C2 and a third capacitor C3. The capacitors C1~C3 are operable to ground AC signals leaked from the inductors L1~L3, and slow down switching time of the 3P3T switch 20.

In detail, the first capacitor C1 connects the first inductor L1 to the ground for filtering the first control signal S1. The second capacitor C2 connects the second inductor L2 to the ground for filtering the second control signal S2. The third capacitor C3 connects the third inductor L3 to the ground for filtering the third control signal S3.

Referring to FIG. 2, a schematic diagram of one exemplary embodiment of a truth table of control signals in the 3P3T switch 20 of FIG. 1 is shown. In one embodiment, only one of the first control signal S1, the second control signal S2 and the third control signal S3 is in high-level, the remaining control signals are in low-level.

When the first control signal S1 is in the high-level, the second diode D2 and the fifth diode D5 are turned on. Therefore, a path from the first pole P1 to the first throw T1 is closed, and a path from the third pole P3 to the second throw T2 is closed.

When the second control signal S2 is in the high-level, the third diode D3 and the sixth diode D6 are turned on. Therefore, a path from the second pole P2 to the first throw T1 is closed, and a path from the third pole P3 and the third throw T3 is closed.

When the third control signal S3 is in the high-level, the fourth diode D4 and the first diode D1 are turned on. Therefore, a path from the first pole P1 and the third throw T3 is closed, a path from the second pole P2 and the second throw T2 is closed.

In one embodiment, the 3P3T switch 20 comprises six diodes D1-D6, which lead to small dimensions, and cut down the cost, as well as simplify the logic of the control signals S1~S3.

Figure 3:
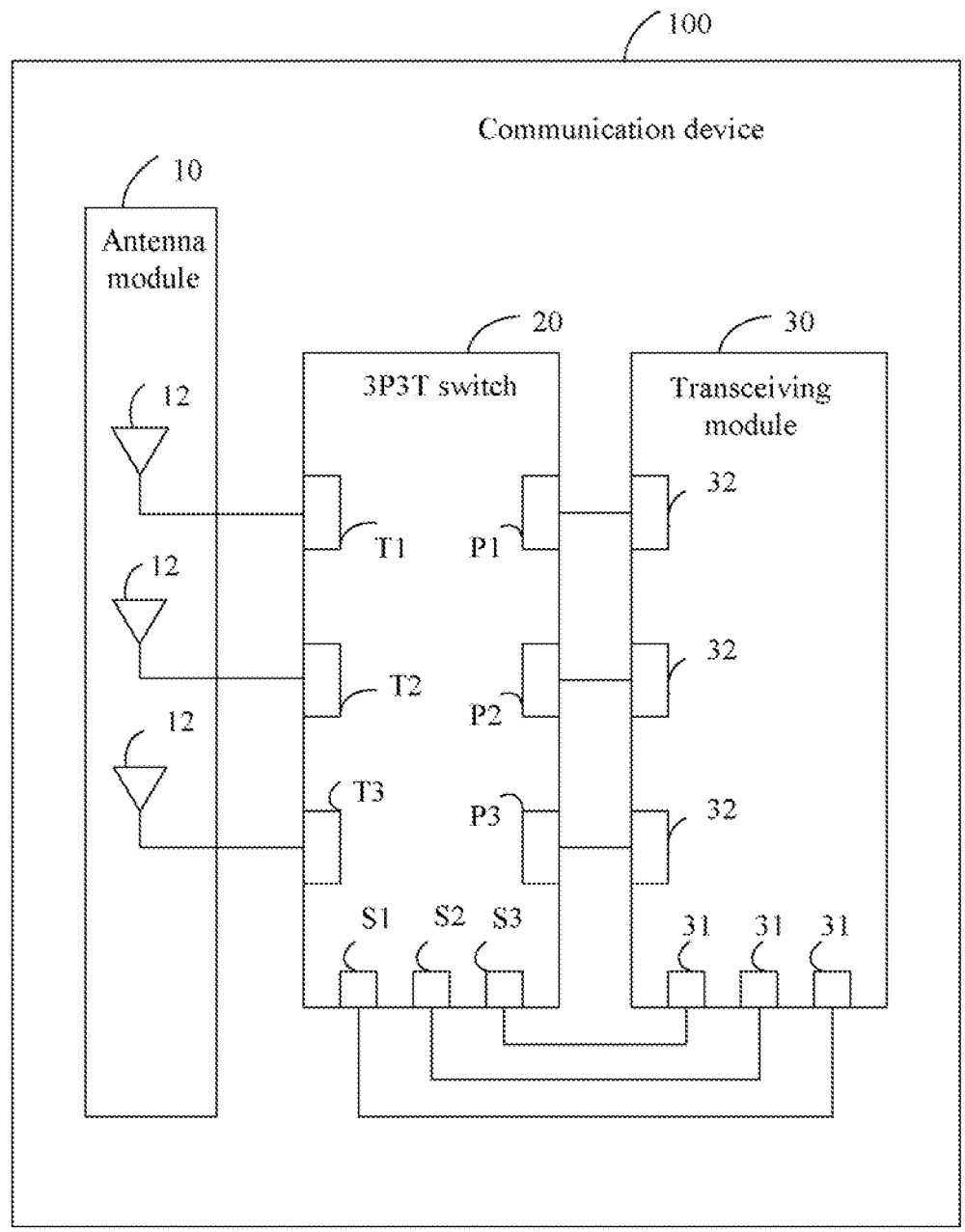
FIG. 3 is a schematic diagram of one exemplary embodiment of a communication device of the present disclosure.

Referring to FIG. 3, a schematic diagram of one exemplary embodiment of a communication device 100 of the present disclosure is shown. The communication device 100 comprises an antenna module 10, a transceving module 30, and the 3P3T switch 20 shown in FIG. 1.

The antenna module 10 comprises three antennas 12 connected to the first throw T1, the second throw T2, and the third throw T3, respectively. In one embodiment, the three antennas 12 may be multi-band antennas or broad-band antennas, to cover three operating frequency bands. For example, the three antennas 12 in the antenna module 10 cover 2.3 GHz in WI-FI, 2.3 GHz in long term evolution (LTE), and 2.5 GHz in WIMAX. In other embodiments, the three antennas 12 may cover three different operating frequency bands according to different designs.

The transceiving module 30 comprises three control submodules 31 and three transceiving submodules 32. In one embodiment, the three transceiving submodules 32 connect to the first pole P1, the second pole P2, and the third pole P3, respectively. A first one of the three control submodules 31 connects to the first inductor L1 and the fourth inductor L4, and generates and sends the first control signal S1 A second one of the three control submodules 31 connects to the second inductor L2 and the fifth inductor L5, and generates and sends the second control signal S2. A third one of the three control submodules 31 connects to the third inductor L3 and the sixth inductor L6, and generates and sends the third control signal S3. The three control submodules 31 are operable for generating and sending the first, second and third control signals S1~S3 respectively, to control paths between the antenna 12 and the transceiving submodule 32.

Figure 4:
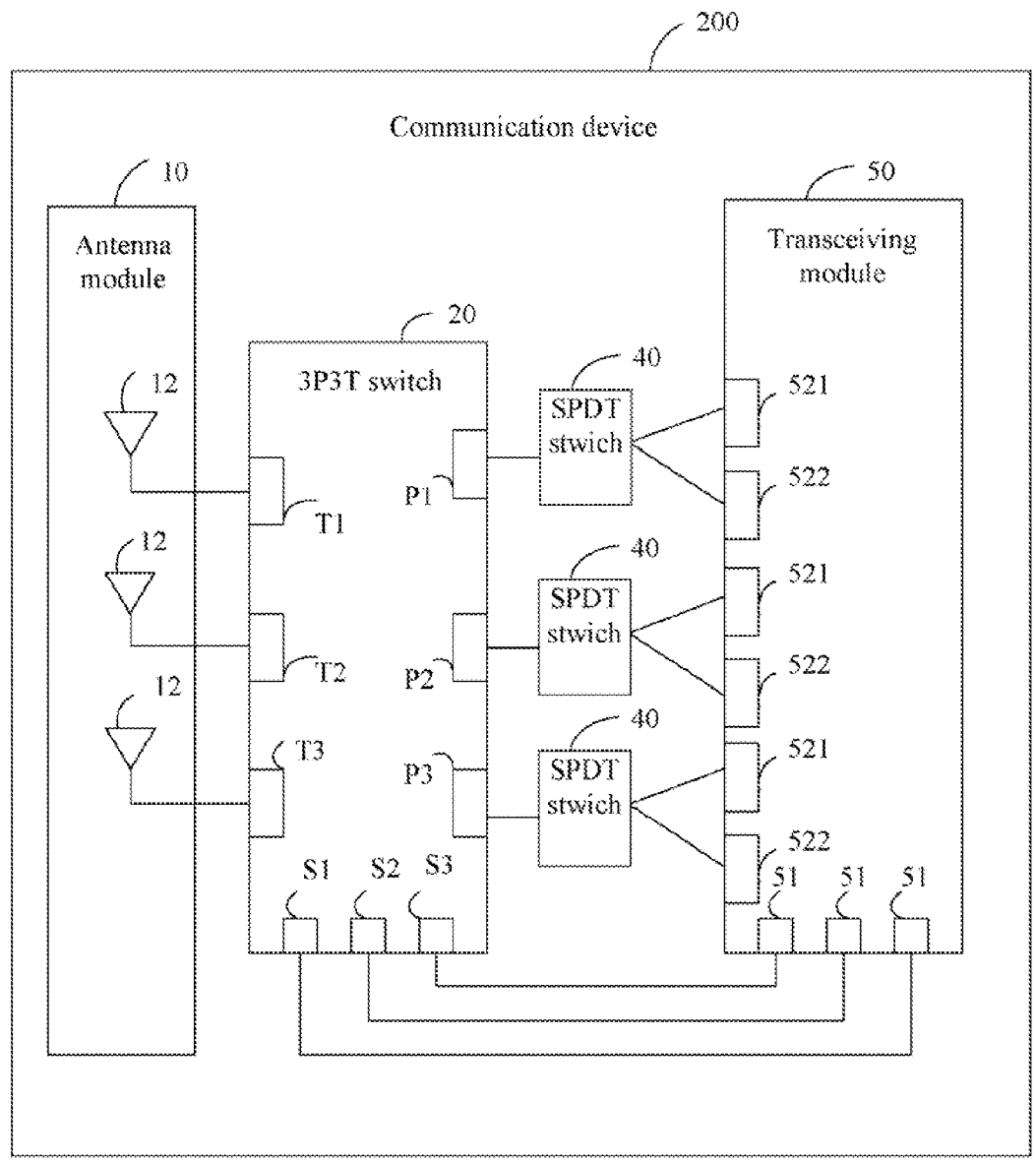
FIG. 4 is a schematic diagram of another exemplary embodiment of the communication device of the present disclosure.

Referring to FIG. 4, a schematic diagram of another exemplary embodiment of the communication device 200 of the present disclosure is shown. The communication device 200 of this embodiment is similar to the communication device 100 of FIG. 3, and the difference is that the communication device 200 further comprises three single-pole double-throw (SPDT) switches 40 and a different transceiving module 50.

The transeiving module 50 comprises three transmitting submodules 521, three receiving submodules 522, and three control submodules 51.

A first one of the three control submodules 51 connects to the first inductor L1 and the fourth inductor L4, and generates and sends the first control signal S1 A second one of the three control submodules 51 connects to the second inductor L2 and the fifth inductor L5, and generates and sends the second control signal S2. A third one of the three control submodules 51 connects to the third inductor L3 and the sixth inductor L6, and generates and sends the third control signal S3. The three control submodules 51 are operable for generating and sending the first, second and third control signals S1~S3 respectively, to control paths between the antenna 12 and the transceiving submodule 32.

A pole of each SPDT switch 40 connects to one pole of the 3P3T switch 20, and two throws of each SPDT switch 40 connect to one transmitting submodule 521 and one receiving submodule 522 of the transeiving module 50, to separate receiving signal and transmitting signals for the communication device 200.

The description of the present disclosure has been presented for purposes of illustration and description, and is not intended to be exhaustive or limited to the disclosure in the form disclosed. Many modifications and variations will be apparent to those of ordinary skill in the art. Various embodiments were chosen and described in order to best explain the principles of the disclosure, the practical application, and to enable others of ordinary skill in the art to understand the disclosure for various embodiments with various modifications as are suited to the particular use contemplated.

What is claimed is:

1. A communication device, comprising:
   a three-pole three-throw switch comprising six diodes connected in series with a same direction, wherein a common node of a cathode of a first one of the diodes and an anode of a second one of the diodes forms a first pole, and receives a first control signal via a first inductor; a common node of a cathode of the second one of the diodes and an anode of a third one of the diodes forms a first throw, and receives a second control signal via a second inductor; a common node of a cathode of the third one of the diodes and an anode of a fourth one of the diodes forms a second pole, and receives a third control signal via a third inductor; a common node of a cathode of the fourth one of the diodes and an anode of a fifth one of the diodes forms a second throw, and receives the first control signal via a fourth inductor; a common node of a cathode of the fifth one of the diodes and an anode of a sixth one of the diodes forms a third pole, and receives the second signal via a fifth inductor; a common node of a cathode of the sixth one of the diodes and an anode of the first one of the diodes forms a third throw, and receives the third control signal via a sixth inductor; a first capacitor to connect the first inductor to the ground, a second capacitor to connect the second inductor to the ground, a third capacitor to connect the third inductor to the ground;
   an antenna module comprising three antennas connected to the first throw, the second throw, and the third throw, respectively; and
   a transceiving module comprising three transceiving submodules and three control submodules, wherein the three transceiving submodules connect to the first pole, the second pole, and the third pole, respectively, a first one of the three control submodules connects to the first inductor and the fourth inductor, and generates and sends the first control signal, a second one of the three control submodules connect to the second inductor and the fifth inductor, and generates and sends the second control signal, and a third one of the three control submodules connects to the third inductor and the sixth inductor, and generates and sends the third control signals.

2. The communication device as claimed in claim 1, further comprising three single-pole double-throw (SPDT) switches, wherein each of the three transceiving submodules comprises a transmitting submodule and a receiving submodule, wherein a pole of each of the three SPDT switches connects to a pole of the three-pole three-throw switch, a first throw of each of the three SPDT switches connect to the transmitting submodule, and a second throw of each of the three SPDT switches connect to the receiving submodule of each of the three transceiving submodules.

* * * * *